United States Patent [19]

Grudkowski

[11] Patent Number: 5,243,556
[45] Date of Patent: Sep. 7, 1993

[54] ACOUSTIC CHARGE TRANSPORT MEMORY DEVICE

[75] Inventor: Thomas W. Grudkowski, Glastonbury, Conn.

[73] Assignee: United Technologies Corporation, Hartford, Conn.

[21] Appl. No.: 658,825

[22] Filed: Feb. 22, 1991

[51] Int. Cl.$^5$ .................. G11C 11/00; H01L 29/746; H03H 9/00; G06M 3/00

[52] U.S. Cl. ................................. 365/157; 257/245; 333/150; 333/152; 333/154; 333/165; 377/26; 377/75

[58] Field of Search ................ 365/157; 357/26; 333/150, 152, 154, 165; 377/26, 75; 257/245

[56] References Cited

U.S. PATENT DOCUMENTS

| | | | |
|---|---|---|---|
| 3,662,355 | 5/1972 | Kazan | 365/157 |
| 3,668,662 | 6/1972 | Zimmerman et al. | 333/150 |
| 3,886,529 | 5/1975 | Bert et al. | 333/154 |
| 4,893,161 | 1/1990 | Tanski et al. | 357/16 |
| 5,107,310 | 4/1992 | Grudkowski et al. | 357/26 |

OTHER PUBLICATIONS

IEEE Transactions on Microwave Theory and Techniques, vol. MTT-29, No. 5, May 1981, "Surface-Acoustic-Wave Random-Access Memories", by Manes, pp. 498-506.
1972 Vitrasonics Symposium Proceedings, "High Data Rate-High Bit Density Acoustic Digital Memory" by Zimmerman et al., pp. 359-364.

*Primary Examiner*—William Mintel
*Assistant Examiner*—Steven Lake
*Attorney, Agent, or Firm*—Eric W. Petraske

[57] ABSTRACT

A sampling device operating as a buffer between a first data signal and a relatively slow processing device accepts the input signal and stores samples of it on a SAW traveling past an input electrode. A blocking potential is applied to a set of electrodes to store a set of charge packets with the SAW device. Packets are consecutively released at a slower rate accommodated to the needs of the next processing unit in line, to read out the sampled signal at a modified rate for intentional distortion of the input signal, for slowing the output stored signal rate, or for time reversal of the signal.

8 Claims, 1 Drawing Sheet

ACOUSTIC CHARGE TRANSPORT MEMORY DEVICE

CROSS REFERENCE TO RELATED APPLICATIONS

This application is related to the subject matter disclosed and claimed in issued U.S. Pat. No. 5,107,310 entitled "ACT Device with Buffer Channel", by Thomas W. Grudkowski and Eric W. Petraske and U.S. Ser. No. 07/658,824 entitled "ACT Device having optical control of SAW velocity", by Thomas W. Grudkowski filed on even date herewith and assigned to the same assignee herein incorporated by reference.

TECHNICAL FIELD

The field of the invention is that of signal processing with surface acoustic wave devices capable of transporting electronic charge, referred to as ACT (acoustic charge transport) devices, and HACT, an improved ACT having a heterostructure in the semiconductor layer used for charge transport.

BACKGROUND ART

It is known to sample a signal by feeding the signal into the input of a GaAs (or other suitable piezoelectric semiconductor) ACT or into the input of a GaAs/AlGaAs (or other suitable heterostructure) HACT device which injects electrons into a semiconductor layer where they are carried along from an input electrode towards an output electrode by a surface acoustic wave (SAW). For convenience, the term ACT will be taken to mean both ACTs and HACTs. Conventional ACT processing uses tap electrodes positioned between the input and the output electrodes to sample the signal as it passes along the device. It is also known that an ACT/HACT memory structure can be used to impose a uniform blocking potential on the tapping electrodes, so that the attractive force of the potential captures the charge packets and prevents them from being carried by the SAW. When the potential is released, after a variable delay period, the charged packets are carried along by the SAW and are read out at the output electrode at the same rate at which they are entered. Since the speed of SAW input sampling is fast, having a typical SAW frequency range of 50 to 1000 MHz, the readout time between packets may be too fast in general for analog to digital processing of the output signal, or other post signal processing that takes a relatively long time. In addition, conventional ACT/HACT memory device operation results in a uniform delay for all of the stored samples of the input waveform. The art has sought a way to read out stored sampled waveforms at a different and slower rate than the rate at which the input waveform enters a storage device.

DISCLOSURE OF INVENTION

The invention is directed at an improved ACT/HACT (the term ACT will be taken to include also HACT) memory device in which the signal is sampled by the process of electron injection into a device and is stored by the imposition of a blocking potential at a predetermined time. The signal is read out by selectively releasing one charge packet after another with a controllable time interval between consecutive charge packets. The time interval is adapted to the requirements of the next signal processing unit in line.

Other features and advantages will be apparent from the specification and claims and from the accompanying drawings which illustrate an embodiment of the invention.

BEST MODE FOR CARRYING OUT THE INVENTION

Figure 1:
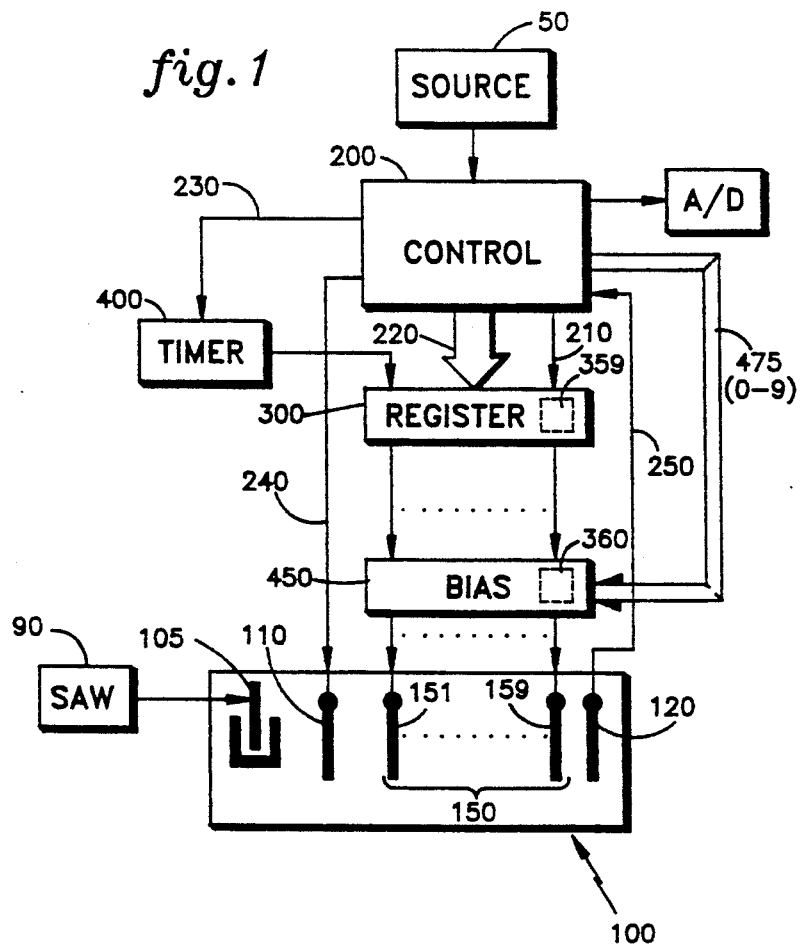
FIG. 1 illustrates in partially pictorial, partially schematic form, an embodiment of the invention.

Referring now to FIG. 1, there is shown a FIFO (first-in-first-out) memory constructed from an ACT/HACT device 100 in a top view having an input electrode 110 and an output electrode 120. ACT/HACT device 100 may be constructed as described in U.S. Pat. No. 4,893,161 or other conventional ACT or HACT geometry embodiments. A SAW signal is generated by transducer 105 controlled by a SAW frequency generator 90. A data signal comes from a source 50 through a controller 200, then along line 240 into the input electrode 110 of the device. This signal is sampled by the SAW waveform as it passes beneath electrode 110, so that electron packets are injected into the charge transport channel.

When enough time has passed so that the SAW wave has carried the sampled signals past a series of tap electrodes, labeled 151 for the first one 159 for the last one and collectively referred to by the numeral 150, a blocking voltage of conventional magnitude, which is usually less than several volts and greater than the SAW potential of less than or equal to 1 volt, is applied to electrodes 150 by switching device 300, which in this embodiment is a shift register that will be described below. A potential is applied to each of tap electrodes 150 sufficient to trap and hold the charge packet then underneath it, thereby acting as trapping electrodes. The stored signal may cover only a portion of the tap electrodes and need not have a long enough duration to extend the entire length. The sampled waveform is thus stored for as long as the blocking potential is present, and consistent with the charge storage time in the semiconductor (typically between 100–1000 $\mu$sec). The SAW is preferably continuous throughout the storage process, so that it need not be restarted when the charge packets are released.

When the blocking potential is released on one or more electrodes, the SAW will carry the corresponding charge packet(s) to output electrode 120. A signal corresponding to the magnitude of the sampled input signal then appears on electrode 120 for further processing as desired. Shift register 300 has a number of cells 351–359, one cell corresponding to each of tap electrodes 150. It includes conventional serial or parallel load hardware. Controller 200 sends signals along line 230 to timer 400 which, in turn, sends signals to shift register 300. The control signals going into shift register 300 come from controller 200 along line 210. Signals may also be sent on a bus indicated by the arrow labeled 220 to shift register 300 in a parallel load fashion. The convention will be used here that a logic 1 signal represents the voltage required to trap a charge packet and the logic 0 signal is the absence of that voltage. The magnitude of the voltage will depend on the particular geometry and electrical characteristics of the ACT/HACT device in question and is readily determined by those skilled in the art. When it is desired to store the data signal carried by the SAW, timer 400 will send a signal to register 300 which will pass out a uniform logic 1 to each of tap electrodes 150. Those skilled in the art will readily appreciate that electrodes 150 may be in constant electrical contact with the cells of register 300, may be gated to respond to the cell data only when the gate is open, etc.

When it is desired to read out the stored signal, zeros will be shifted into shift register 300 along line 210, one by one. After the first zero is shifted into cell 359, corresponding to tap electrode 159, the tap electrodes are exposed to the new configuration with the blocking potential being on all but one of the electrodes. The last charge packet, under electrode 159, is now free to move and will be carried by the SAW to output electrode 120 from which a signal will travel along line 250 into controller 200 and out into analog to digital converter 500.

At the next stage, after a delay that is set to accommodate the next processing unit connected to output electrode 120, another zero has been shifted into register 300 and both the packets beneath electrode 159 and the next one to its left are now free. The next charge packet in sequence is released from the next electrode, passes under electrode 159 and on out to the output electrode 120. This process continues until all the charge packets have been released, with whatever spacing or time interval that is desired between them. Conventionally, this time interval will be uniform, but it does not need to be.

Figure 3:
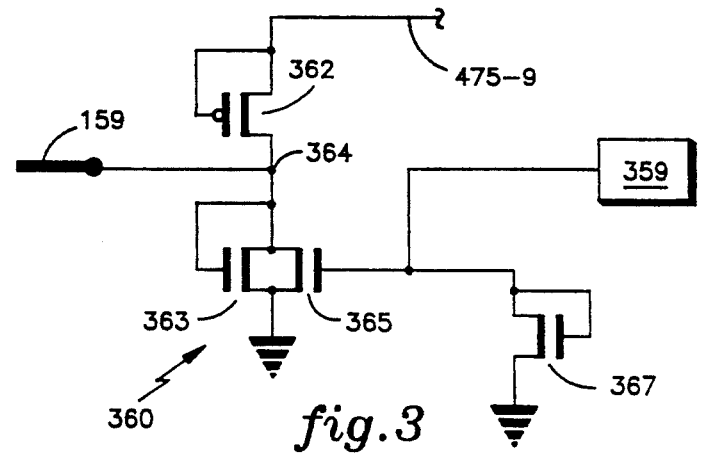
FIG. 3 illustrates a bias circuit for use with the invention.

The implementation of this method of releasing samples will be evident to those skilled in the art. For example, a bias network shown schematically in FIG. 1 as box 450 will maintain the tap electrodes at the blocking potential unless they are pulled down by a zero in register 300. A simple interface that may readily adapted by those skilled in the art is shown as subcircuit 360 of FIG. 3, in which a pair of transistors 362 and 363 are connected in series between 475-9, the ninth line in bundle 475, and ground. An intermediate node 364 is connected to electrode 159 and controlled by transistor 365 that, in turn, is controlled by cell 359 of register 300. If line 475 is at a positive potential calculated to maintain node 364 at the blocking potential, and transistor 365 is a conventional N-channel FET, the application of a positive voltage to the gate will bring node 364 close to ground and a zero potential on the gate will allow node 364 to rise toward the voltage set by the ratio of resistances associated with transistors 362 and 363. Optional pull-down transistor 367 is sized to not disturb the operating points, only to pull down the gate of transistor 365 if the output of cell 359 is floating. Those skilled in the art will readily be able to modify the transistor polarity or bias level, etc. to accommodate their needs. It does not hurt if the shifting hardware within cell 359 temporarily shifts logic states during the transfer process so that electrode 159 shifts between the blocking potential and the release potential while control bits are shifted through cell 359, because there is no charge packet beneath it to be affected.

Figure 2:
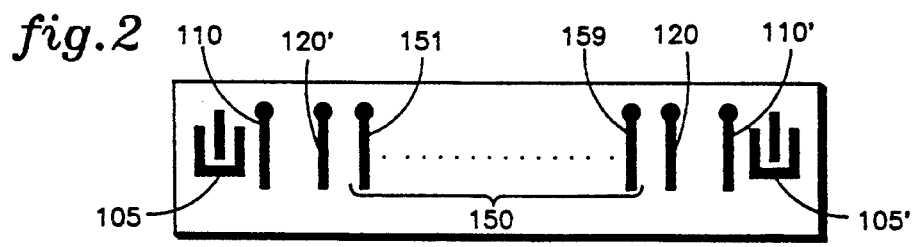
FIG. 2 illustrates an alternative embodiment.

Referring now to FIG. 2, there is shown an alternative version of ACT/HACT device 100. In this version, there is an additional set of transducer, input, and output electrodes 105', 110', 120', respectivley. In this case, the output (or pickup) electrodes 120, 120' may be separate or the same as the signal input electrode 110, 110', respectively. The counterpart input electrode 110' and output electrode 120' are connected to the controller 200 in a similar manner as the input electrode 110 and output electrode 120, respectively. If the counterpart output electrode 120' is the same as the input electrode 110, the controller 200 must contain circuitry to multiplex between providing input signals when the common electrode (110,120') is used as an input electrode, and accepting output signals when the electrode (110,120') is used as an output electrode. A similar arrangement exists for the counterpart input electrode 110' and the output electrode 120. Counterpart transducer 105' and output electrode 120' permit "time-reversal" of the incoming signal. Once the signal has been stored by application of the proper voltage to electrodes 150, the SAW generated by transducer 105 may be turned off and replaced by a SAW generated by transducer 105'. In that case, the first charge packet to be released from output electrode 120' is that stored under electrode 151 and the last charge packet to be released is that stored under electrode 159. The effect is that of reversing the sequence in time of the signal: This embodiment may be used in implementing a LIFO (last-in-first-out) memory or in many other applications evident to those skilled in the art.

Those skilled in the art will readily be able to devise different embodiments of the invention. For example, shift register 300 may be replaced with a conventional decoder, in which case the release operations may be performed by control 200 sending a sequentially increasing number to the decoder which, in turn, opens consecutively the right-most electrode 159 and then the others. A ROM or other PLA device could be used to respond to an input count or signal in a nonlinear fashion, so that a signal that is sampled at the uniform time internal of the SAW may be released with a variable time interval between samples. The path between source 50 and lines 240 within control 200 may be a direct connection, or the path may pass through a gate, either a linear gate for analog applications or a nonlinear gate for digital applications. In the former case, the connection is effectively outside controller 200. In the latter case, the connection may be controlled so that the sampling is selective. For example, the input signal could be sampled on the occurrence of some condition detected by some portion of a total system, with an irregular flow of samples into unit 100. Each sample would be trapped by the application of a blocking potential to the last unoccupied electrode at a time when the charge packet passes through. They can then be released at regular or irregular intervals.

As an additional example, if a complex signal is to be sampled at a higher rate during some portion of the total sampling period, the SAW can be run at multiple of the lowest desired sampling rate (e.g., 180 MHz, for a 90 MHz lowest rate). During periods of high interest, the signal is passed through and sampled at the full rate. During periods of less interest, the signal is gated through at only every tenth SAW peak, so that the sampling rate is one tenth of the maximum rate. Further, the device may be used to sum two or more consecutive charge packets. If the next device in line will store the released charge from electrode 120 for a period greater than the delay between consecutive SAW peaks, two or more electrodes may be switched to the release potential, so that their charge packets will be summed in the next unit. Also, summing may be performed within device 100 by holding the nth electrode at the blocking potential while the packets are trapped beneath it.

The sampling operation at electrode 110 is conventionally performed with a bias to put the device in a more linear range, so that a zero signal will be represented by a finite amount of charge. This charge is a simple offset that can be subtracted off as is convenient. When "empty" packets accumulate under an nth electrode, the offset amounts will accumulate there. This problem may be solved by accumulating the empty packets under the nth electrode and trapping the desired packet under the next free electrode toward the input terminal (the (n−1)th electrode in this case). The accumulated charge under the nth electrode will pass out through the output and be ignored by the next unit in line. The same logic that identified the desired packet to be trapped will pass a flag signal identifying the (n−1)th electrode as the one having a packet of interest and the preceding nth electrode as the one with the packet to be discarded.

The different logical units shown in the drawing may be combined or separated in various fashions, well known to those skilled in the art. For example, a single-chip general purpose computer may perform the functions of units 200, 400 and 300. Similarly, the function of controlling the tap electrodes may be accomplished by a register as shown or by a modulation algorithm that releases the electrodes consecutively, in response to signals from controller 200. Such applications for varying the time between release of the sampled charge may be useful for modulating the signal time or phase of the input signal for intentional signal distortion. The input sampling may be controlled through timer 400 to select various portions of the input signal to be initially sampled. Since the sampling process is linear, the device is well suited to analog applications, but it can be used to advantage in digital applications as well.

It should be understood that the invention is not limited to the particular embodiments shown and described herein, but that various changes and modifications may be made without departing from the spirit and scope of this novel concept as defined by the following claims.

What is claimed is:

1. A memory device employing surface acoustic waves in an integrated circuit comprising:
    first means for generating a SAW in a piezoelectric—SAW device structure having a charge transport layer, disposed above a semiconductor substrate in a semiconductor chip, said SAW travelling in a predetermined direction along a SAW axis from a SAW generator transducer along an ACT structure;
    an input electrode on a surface of said structure, for injecting electron packets into said charge transport layer, so that said electron packets are transported by said SAW through said charge transport layer substrate;
    a first output electrode structure for detecting said electron packets in said charge transport layer;
    a plurality of trapping electrodes disposed between said input electrode and said first output electrode; and
    means for applying a blocking potential to said trapping electrodes at a predetermined potential value sufficient to trap said electron packets in proximity to corresponding trapping electrodes, whereby a plurality of electron packets may be stored within said ACT structure, characterized in that:
    said memory device further includes selection means for selectively applying signals to individual ones of said trapping electrodes;
    said memory device further includes timing means for sending signals through said selection means at the predetermined times; and
    said memory device further includes controller means for applying a predetermined sequence of timing signals to predetermined ones of said trapping electrodes to cancel said blocking potential, whereby said plurality of electron packets are selectively released and read out by said first output electrode at a predetermined readout rate.

2. A memory device according to claim 1, further characterized in that:
    at least one of said selection means, said timing means, and said controller means is formed in an integrated circuit disposed above said semiconductor substrate on said semiconductor chip.

3. A memory device according to claim 1, further characterized in that:
    all of said selection means, said timing means, and said controller means are formed in an integrated circuit disposed above said semiconductor substrate on said semiconductor chip.

4. A memory device according to claim 1, further characterized in that:
    said SAW has a SAW frequency and said readout rate is less than said SAW frequency, whereby consecutive released packets are separated by at least one peak of said SAW.

5. A memory device according to claim 1, further characterized in that:
    a second means for generating a SAW is located along said SAW axis a distance from said first means for generating a SAW greater than the distance from said first means for generating a SAW to said first output electrode;
    said controller means includes means for canceling said blocking potential in a last-in-first-out sequence in which packets closest to said input electrode are released sequentially, whereby a closest packet to said input electrode is released first; and
    a second output electrode, disposed in proximity to said input electrode, is connected to an alternate output connection, whereby said device functions as a last-in-first-out memory in which data is blocked and released to exit from said second output electrode.

6. A memory device according to claim 5, further characterized in that:
    said second output electrode and said input electrode are the same electrode.

7. A memory device according to claim 1, further characterized in that:
    said controller means includes means for applying said blocking potential to a first selected trapping electrode while charge packets accumulate under said first selected trapping electrode.

8. A memory device according to claim 7, further characterized in that:
    said controller means includes means for applying said blocking potential to said first selected trapping electrode while charge packets accumulate under said first selected trapping electrode and then applying said blocking potential to a second selected trapping electrode closer to said input electrode than said first selected trapping electrode, whereby unwanted charge packets accumulate under said first selected trapping electrode until a desired packet is trapped under said second selected trapping electrode.

* * * * *